United States Patent [19]

Ogura

[11] Patent Number: 5,703,898
[45] Date of Patent: Dec. 30, 1997

[54] SURFACE EMISSION LASER AND METHOD OF MANUFACTURING THE SAME

[75] Inventor: Ichiro Ogura, Tokyo, Japan

[73] Assignee: NEC Corporation, Tokyo, Japan

[21] Appl. No.: 569,060

[22] Filed: Dec. 8, 1995

[30] Foreign Application Priority Data

Dec. 21, 1994 [JP] Japan .................. 6-335832

[51] Int. Cl.⁶ .................. H01S 3/08; H01S 3/19; H01L 21/20
[52] U.S. Cl. .................. 372/96; 372/99; 372/45; 372/46; 437/129
[58] Field of Search .................. 372/96, 46, 45, 372/99; 437/129

[56] References Cited

U.S. PATENT DOCUMENTS

| | | | |
|---|---|---|---|
| 5,258,316 | 11/1993 | Ackley et al. | 372/45 X |
| 5,317,587 | 5/1994 | Ackley et al. | 372/96 X |
| 5,392,307 | 2/1995 | Sugiyama et al. | 372/96 |
| 5,408,486 | 4/1995 | Shojji | 372/99 |
| 5,432,809 | 7/1995 | Grodzinski et al. | 372/45 |
| 5,478,774 | 12/1995 | Ackley et al. | 437/129 |
| 5,513,202 | 4/1996 | Kobayashi et al. | 372/99 |

OTHER PUBLICATIONS

K. Kurihara et al.; "Double–Mesa–Structure Vertical–to–Surface Transmission Electro–Photonic Device with a Vertical Cavity"; Japan Journal of Applied Physics, vol. 32 (1993) pp. 604–608. (no month).

*Primary Examiner*—Rodney B. Bovernick
*Assistant Examiner*—Luong-Quyen T. Phan
*Attorney, Agent, or Firm*—Whitham, Curtis, Whitham & McGinn

[57] ABSTRACT

A surface emission laser is formed by sequentially stacking an n-type semiconductor multilayer reflector, an n-type clad layer, an active layer, a p-type clad layer, and a p-type semiconductor multilayer reflector on a semiconductor substrate. The p-type semiconductor multilayer reflector is etched to form a mesa. An electrode is formed on at least on the mesa side surfaces and a portion of the mesa bottom surface. The thickness of a GaAs film as the mesa bottom surface of the p-type semiconductor multilayer reflector to which an etching process is stopped is set to be (¼+n/2, where n is an integer) times the oscillation wavelength. A method of manufacturing the surface emission laser is also disclosed.

7 Claims, 4 Drawing Sheets

LASER BEAM

SURFACE EMISSION LASER AND METHOD OF MANUFACTURING THE SAME

BACKGROUND OF THE INVENTION

1. Field of the Invention

The present invention relates to a method of manufacturing a surface emission laser and, more particularly, to a method of manufacturing a surface emission laser having p- and n-type semiconductor multilayer reflectors, each formed by stacking semiconductor layers having different refractive indexes.

2. Description of the Prior Art

In order to realize high-density, wide-band information transmission based on the parallelism of light, surface emission laser elements have been enthusiastically studied. A surface emission laser includes an optical resonator which is formed in the vertical direction by using a multilayer Bragg reflector obtained by mainly stacking two types of semiconductor layers with different refractive indexes, each having a thickness ¼ times the oscillation wavelength, on a semiconductor substrate. With this structure, light is emitted in the vertical direction. This laser is characterized in that high-density integration can be attained two-dimensionally. In order to realize parallel optical transmission making use of this characteristic feature of the surface emission laser element, the surface emission laser is integrated in the form of an array.

In operating a laser element with such an integrated structure, heat is generated as the element consumes power. First, in order to solve this problem, the oscillation threshold current and the element resistance must be decreased to suppress the generation of heat. In addition, a structure capable of efficient heat dissipation must be used. Second, in order to make the characteristics of elements uniform, an optimal structure and an optimal element manufacturing process must be realized.

In a surface emission laser element, the element resistance is high because of the potential barrier at a junction surface which is based on the energy gap difference between the two types of semiconductors constituting a semiconductor multilayer reflector. In order to decrease the element resistance, a semiconductor having an intermediate composition between the compositions of the two types of semiconductors is inserted in the junction surface to decrease the potential barrier, or the impurity concentration is increased. In addition to these methods, a method of using a structure designed to inject currents bypassing a semiconductor multilayer film is being studied.

As an example of the latter, the double mesa structure of a surface emission laser is reported in Japanese Journal of Applied Physics, "Double-Mesa-Structure Vertical-to-Surface Transmission Electron-Photonic Device with a Vertical Cavity", Vol. 132, pp. 604–608, 1993.

The above prior art will be described with reference to FIG. 1.

FIG. 1 shows a double mesa structure as a conventional surface emission laser structure. In this structure, in forming a p-type semiconductor multilayer reflector portion 55 on the upper surface side as a first mesa, an etching process is performed up to a p-type GaAs layer 53 on a spacer layer 56 including an active layer 54. An anode electrode 40 is formed on this mesa. A portion outside the mesa is further etched to expose an n-type semiconductor multilayer reflector 51 on a GaAs substrate 10, thereby forming a cathode electrode 41. Ions are implanted into a portion around the first mesa. As a result, an active layer portion other than the mesa portion is formed into a high-resistance region 50. Reference numeral 52 denotes an insulating film.

A current is injected from the anode electrode 40 formed to cover the mesa by the first mesa etching. Most of the current is injected, in the lateral direction, from the mesa bottom surface rather than the p-type semiconductor multilayer reflector portion 55 having a high resistance, i.e., from the portion formed on the semiconductor layer to which the etching process is stopped.

The position where the first mesa etching process is stopped greatly influences the spread of light into the element in the lateral direction, or the light confining characteristics of the element. This is a factor which determines a transverse mode of the emission characteristics of the surface emission laser. According a report, as the structure requirements for single mode characteristics, the size of the first mesa is 6 μm or less, and an etching process is stopped at the position where one or two semiconductor multilayer films are left before the spacer. In addition, since GaAs and AlAs are used as materials for the semiconductor multilayer reflectors, the etching process must be stopped at a GaAs layer which can form ohmic connection.

In the prior art, however, with the state-of-the-art dry etching techniques, it is difficult to realize controllability and uniformity which allow an etching process to stop at a specific semiconductor layer having a thickness of several tens nm of a semiconductor multilayer reflector. In addition, since a current is injected into the active layer below the mesa from the lateral direction, the current distribution is not made uniform.

SUMMARY OF THE INVENTION

The present invention has been made to solve the above objects in the prior art, and has as its object to provide a surface emission laser which allows easy control of etching and can decrease the resistance without changing the emission characteristics, and a method of manufacturing the same.

In order to achieve the above object, according to the first aspect of the present invention, there is provided a surface emission laser having a semiconductor multilayer reflector of a first conductivity type, a clad layer of the first conductivity type, an active layer, a clad layer of a second conductivity type, and a semiconductor multilayer reflector of the second conductivity type, which are sequentially stacked on each other, wherein the semiconductor multilayer reflector of the second conductivity type has a mesa shape, an electrode is formed on mesa side surfaces and a portion of a mesa bottom surface, and one semiconductor film of the semiconductor multilayer reflector of the second conductivity type which serves as the mesa bottom surface has a thickness (¼+n/2, where n is an integer) times an oscillation wavelength.

According to the second aspect of the present invention, there is provided a surface emission laser having an n-type semiconductor multilayer reflector, an n-type clad layer, an active layer, a p-type clad layer, and a p-type semiconductor multilayer reflector, which are sequentially stacked on a semiconductor substrate, wherein the p-type semiconductor multilayer reflector has a mesa shape, an electrode is formed on at least mesa side surfaces and a portion of a mesa bottom surface, and a GaAs film of the p-type semiconductor multilayer reflector which serves as the mesa bottom surface has a thickness (¼+n/2, where n is an integer) times an oscillation wavelength.

According to the third aspect of the present invention, there is provided a method of manufacturing a surface emission laser comprising the steps of forming a resonator structure on a semiconductor substrate, the resonator structure having p- and n-type semiconductor multilayer reflectors on and under a p-n junction structure for producing an optical gain upon injection of a current, each of the reflectors being formed by alternately stacking semiconductor layers having different refractive indexes, forming a mesa by etching, and forming an electrode for current injection to cover the mesa, wherein a thickness of a semiconductor layer, of the semiconductor layers alternately stacked on each other to form the semiconductor multilayer reflector on the p-n junction structure etched on the semiconductor substrate, to which an etching process is stopped, is (¼+n/2, where n is an integer) times an oscillation wavelength.

More specifically, in the third aspect, the semiconductor multilayer reflector on the p-n junction structure etched on the semiconductor substrate is a p-type semiconductor multilayer reflector, the semiconductor layers alternately stacked on each other are p-type AlAs layers and p-type GaAs layers, and the semiconductor layer of the semiconductor layers to which an etching process is stopped is a p-type GaAs layer.

In addition, in the third aspect, the p- and n-type semiconductor multilayer reflectors on and under the p-n junction structure for producing an optical gain upon injection of a current, each of the reflectors being formed by alternately stacking semiconductor layers having different refractive indexes, are formed by alternately stacking two types of semiconductor layers having different refractive indexes, and the reflectors are formed on the semiconductor substrate by epitaxial growth.

In the method of manufacturing a surface emission laser, since the thickness of a specific layer of the semiconductor multilayer reflector to which a mesa etching process for forming an electrode is stopped is set to be (¼+n/2, where n is an integer) times, e.g., ⅝ times, the oscillation wavelength, the process can be stopped at this layer with a margin.

In addition, since the thickness of a specific layer of the semiconductor multilayer reflector is set to be a desired value, i.e., (¼+n/2, where n is an integer) times the oscillation wavelength, the optical characteristics, e.g., reflectance, are equivalent to those of a film having a thickness ¼ times the oscillation wavelength as long as the thickness increases by an integer multiple from ¼ to ½. For this reason, in manufacturing an element, an etching process can be performed with a margin without degrading the characteristics of a surface emission laser.

Furthermore, with an increase in the thickness of the specific layer, the effect of spreading the injected current into the semiconductor film in the lateral direction is enhanced, thereby reducing the nonuniformity of injection accompanying current injection from the lateral direction.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF PREFERRED EMBODIMENT

The present invention will be described in detail below with reference to the embodiment shown in the accompanying drawings.

Figure 2:
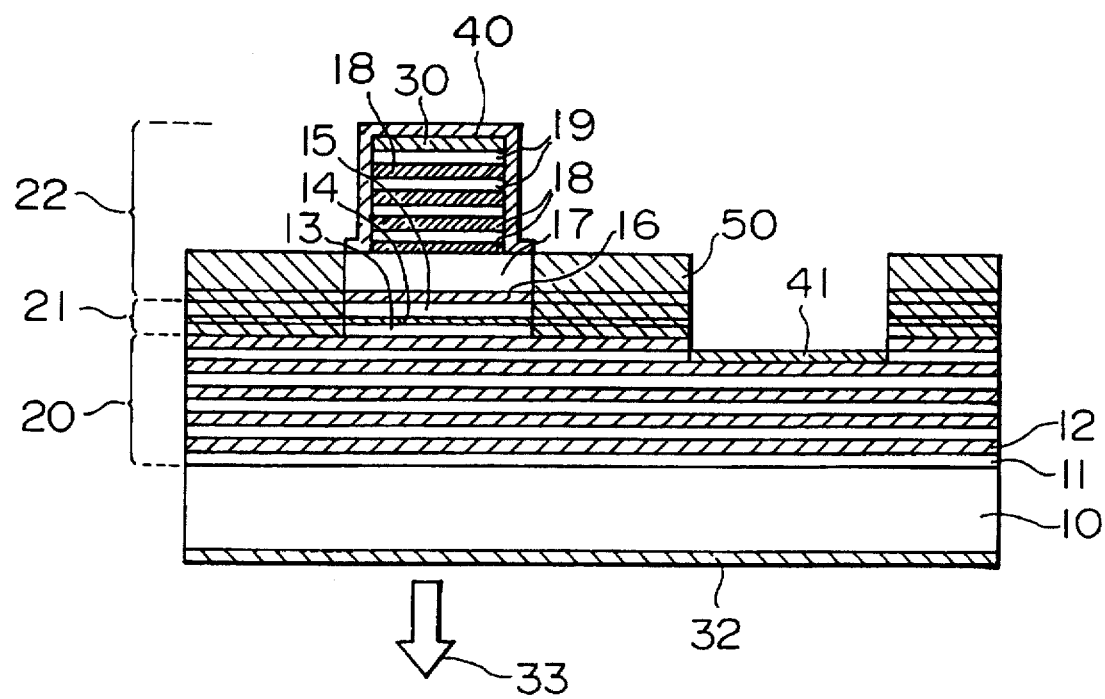
FIG. 2 is a sectional view showing a method of manufacturing a surface emission laser according to an embodiment of the present invention.

FIG. 2 shows a method of manufacturing a surface emission laser according to an embodiment of the present invention.

GaAs and InGaAs are used as materials for a substrate and an active layer, respectively. The emission wavelength of InGaAs is near 980 nm with an In composition of 0.2.

As shown in FIG. 2, an n-type semiconductor multilayer reflector 20 is formed on a GaAs substrate 10. The n-type semiconductor multilayer reflector 20 is formed by stacking n-type GaAs layers 11 and n-type AlAs layers 12, each having an optical thickness ¼ times the laser oscillation wavelength, in about 20 stacking cycles. A p-n junction structure 21 obtained by sequentially stacking an n-type AlGaAs layer 13, an undoped InGaAs active layer 14, and a p-type AlGaAs layer 15 is formed on the n-type semiconductor multilayer reflector 20.

A p-type semiconductor multilayer reflector 22 is formed by stacking a p-type AlAs layer 16, a p-type GaAs layer 17, a p-type AlAs layer 18, and a p-type GaAs layer 19. Each of the p-type AlAs layer 16, the p-type AlAs layer 18, and the p-type GaAs layer 19 has an optical thickness ¼ times the oscillation wavelength. The p-type GaAs layer 17 has an optical thickness (¼+n/2; n is an integer) times the oscillation wavelength.

In forming the p-type semiconductor multilayer reflector 22, the p-type AlAs layer 16 having an optical thickness ¼ times the oscillation wavelength and the p-type GaAs layer 17 having an optical thickness (¼+n/2) times the oscillation wavelength are formed first.

In this case, the thickness of the p-type GaAs layer 17 is set to be ⅝ times the oscillation wavelength. The p-type AlAs layer 18 and the p-type GaAs layer 19, each having an optical thickness ¼ times the oscillation wavelength, are stacked on the resultant structure in 14 stacking cycles. In addition, a GaAs layer 30 having an optical thickness 0.16 times the oscillation wavelength is formed on the resultant structure to perform phase correction with respect to an Au reflecting film to be formed in an element manufacturing step.

When the oscillation wavelength is set to be 980 nm, the optical thickness (=¼ times the oscillation wavelength) of the p-type GaAs layer 19 is 68 nm, and the optical thickness (=¼ times the oscillation wavelength) of each of the p-type AlAs layer 16 and the p-type AlAs layer 18 is 84 nm.

The optical thickness (=⅝ times the oscillation wavelength) of the p-type GaAs layer 17 is 340 nm. These thicknesses are sufficient for etching depth control in manufacturing an element.

Resonance characteristics can be obtained by setting the optical thickness of the p-n junction structure 21 sandwiched between the reflectors 20 and 22 to be an integer multiple of ½ the oscillation wavelength. In this case, the thickness of the p-n junction structure 21 is set to be twice the oscillation wavelength.

In forming a laser structure, first of all, an etching mask six microns square is formed on a wafer in a photoresist step, and the multilayer reflector 22 is etched in the form of a mesa by reactive ion beam etching. The etching depth is controlled by a method of irradiating a laser beam onto the wafer, and observing a periodic change in reflectance.

The etching process is stopped at the p-type GaAs layer 17. The reactive ion beam etching method and the depth control method using a laser beam in this case exhibit the following controllability associated with etching depth. Although it is difficult to accurately stop the etching process at a GaAs layer having an optical thickness ¼ the oscillation wavelength, the process can be easily stopped when the p-type GaAs layer 17 having a thickness ¾ times the oscillation wavelength.

A metal exhibiting ohmic characteristics with respect to p-type GaAs, e.g., Au.Cr or Au.Zn, is deposited to cover the mesa structure formed by etching. The metal around the mesa structure is removed to leave a contact region having a thickness of about 1 μm on the GaAs layer 17 corresponding to the mesa bottom surface to form an anode electrode 40. In addition, an Au film having a thickness of about 1 μm is formed on the anode electrode 40. Proton injection is performed by using this film as a mask to form a high-resistance region 50 around the mesa structure.

A portion at a predetermined distance from the mesa structure is etched in the form of a groove reaching the n-type semiconductor multilayer reflector 20. Thereafter, a metal exhibiting ohmic characteristics with respect to n-type GaAs, e.g., Au.Ge.Ni, is deposited on the groove portion to form a cathode electrode 41.

After the above structure is formed, the GaAs substrate 10 is thinned to about 100 μm. The substrate is then subjected to mirror polishing, and an antireflection coating 32 is formed thereon. A laser beam 33 is emitted from the lower surface of the substrate.

Figure 1:
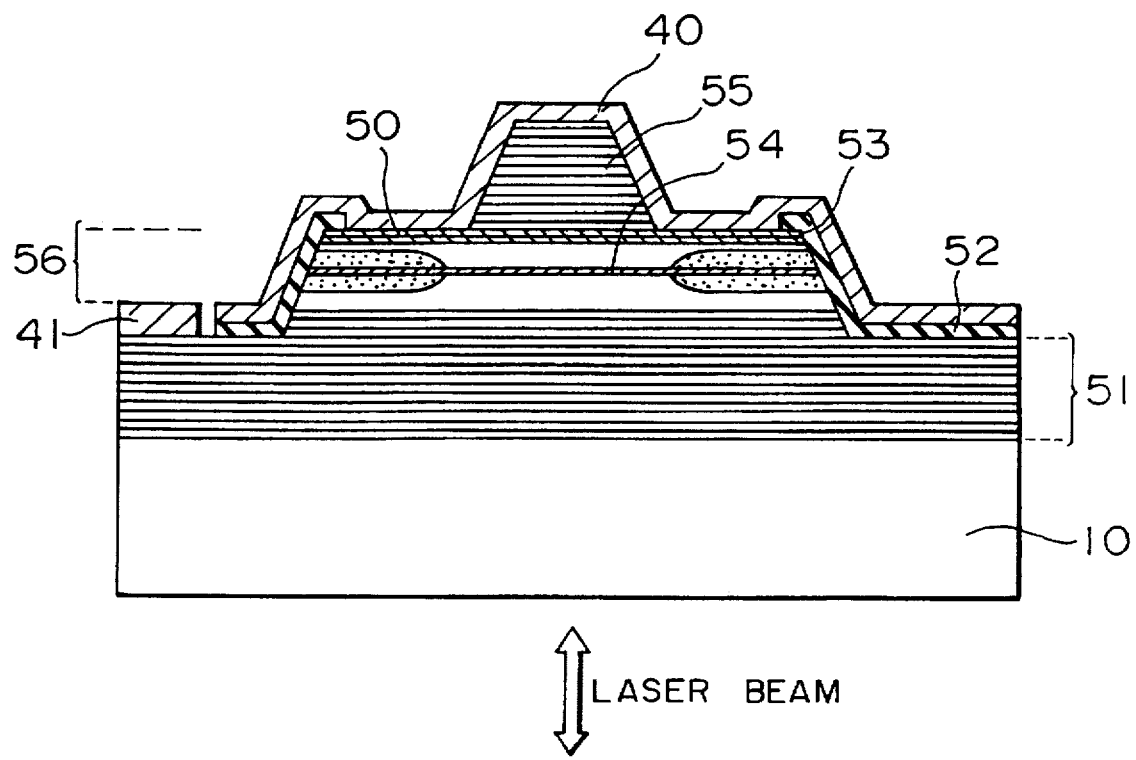
FIG. 1 is a sectional view showing a conventional surface emission laser having a double mesa structure.

The above element manufacturing steps are the same as those in the prior art in FIG. 1 except that the thickness of the p-type GaAs layer 17, to which the etching process is stopped in forming the mesa structure, is set to be ¾ times the oscillation wavelength instead of ¼ times the oscillation wavelength.

Since the thickness of the p-type GaAs layer 17 is increased, etching control is considerably facilitated. In addition, variations in etching depth on a wafer, which are caused by nonuniform planar etching rates, can be absorbed. This makes it possible to stop the etching process at the p-type GaAs layers 17 in all elements.

The resistance decreasing effect of the element will be described next with reference to FIGS. 3A, 3B, and 3C.

Figure 3A:
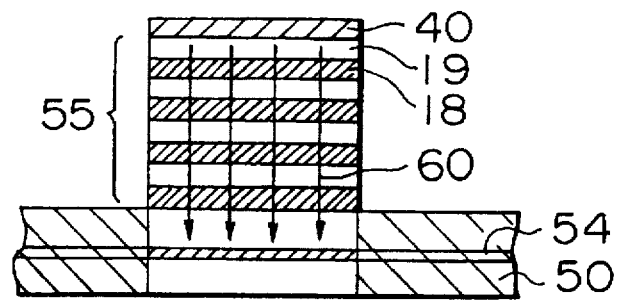
FIGS. 3A to 3C are sectional views for explaining the (spreading) paths of currents injected into elements with reference to an embodiment of the present invention and two comparative examples.

FIG. 3A shows a case wherein an electrode is formed on a multilayer reflector mesa. A p-type semiconductor multilayer reflector 55 is formed by staking AlAs and GaAs layers 18 and 19. An anode electrode 40, an active layer 54, and a high-resistance region 50 are also formed.

Figure 3B:
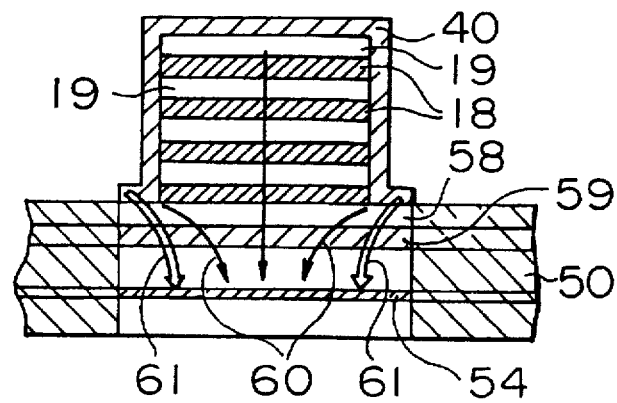

FIG. 3B shows a conventional double mesa structure formed by stacking AlAs and GaAs layers 18 and 19. An AlAs layer 59, a GaAs layer 58, an anode electrode 40, an active layer 54, and a high-resistance region 50 are also formed.

Figure 3C:
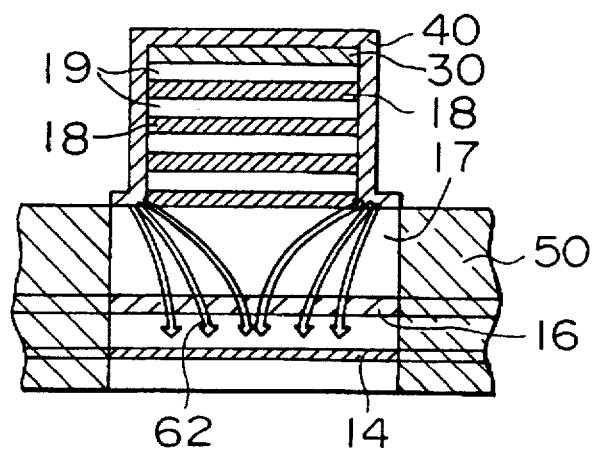

FIG. 3C shows the structure of a surface emission laser of the present invention, in which AlAs and GaAs layers 18 and 19 are stacked on each other, and an anode electrode 40 is formed. In addition, an active layer 14, a p-type AlAs layer 16 having an optical thickness ¼ times the oscillation wavelength, and a p-type GaAs layer 17 having an optical thickness (¼+n/2; n is an integer) times the oscillation wavelength are formed. A high-resistance region 50 is also formed.

FIGS. 3A to 3C show the paths of currents injected into elements to compare the structure in which the anode electrode is formed on only the mesa upper portion (FIG. 3A), the conventional double mesa structure in which the anode electrode is formed to cover the mesa (FIG. 3B), and the structure of the present invention (FIG. 3C) with each other.

In the structure in which the electrode is formed on only the meas upper portion in FIG. 3A, since a current 60 passes through all resistors based on the potential barriers on the heterointerfaces of the p-type semiconductor multilayer reflector 55, the element resistance is high. In the conventional double mesa structure in FIG. 3B, since the layer on the mesa bottom surface, which forms the electrode, has a thickness ¼ times the oscillation wavelength, main current components 61 flow in the manner shown in FIG. 3B. In this case, since it is difficult for the current to spread in the lateral direction, the current concentrates around the mesa. That is, since the current path is narrow, the element resistance is still high. In the structure of the surface emission laser of-the present invention in FIG. 3C, since the layer which forms the electrode is thin, a current is injected into the active layer while it spreads in the lateral direction. That is, since the current path is wide, the element resistance can be decreased. A uniform current distribution 62 can therefore be obtained.

According to values in references, the resistivity of the p-type GaAs layer is set to be $2\times10^{-2}$ $\Omega\cdot$cm; the resistivity of the p-type AlAs layer, $4\times10^{-2}$ $\Omega\cdot$cm; the ohmic resistivity of the p-type GaAs layer, $2\times10^{-6}$ $\Omega\cdot$cm$^2$; and the resistivity of the interface between the p-type GaAs layer and the p-type AlAs layer of the semiconductor multilayer reflector, $1.3\times10^{-6}$ $\Omega\cdot$cm$^2$. When the element resistances of the above structures, each having a mesa size of 6 μm, are estimated under this setting, the structure in FIG. 3A has a resistance of 130 $\Omega$; the structure in FIG. 3B, a resistance of 60 $\Omega$; and the structure of this embodiment of the present invention in FIG. 3C, a resistance of 26 $\Omega$. That is, the element resistance can be decreased to ½ or less than that of the conventional double mesa structure.

Figure 4:
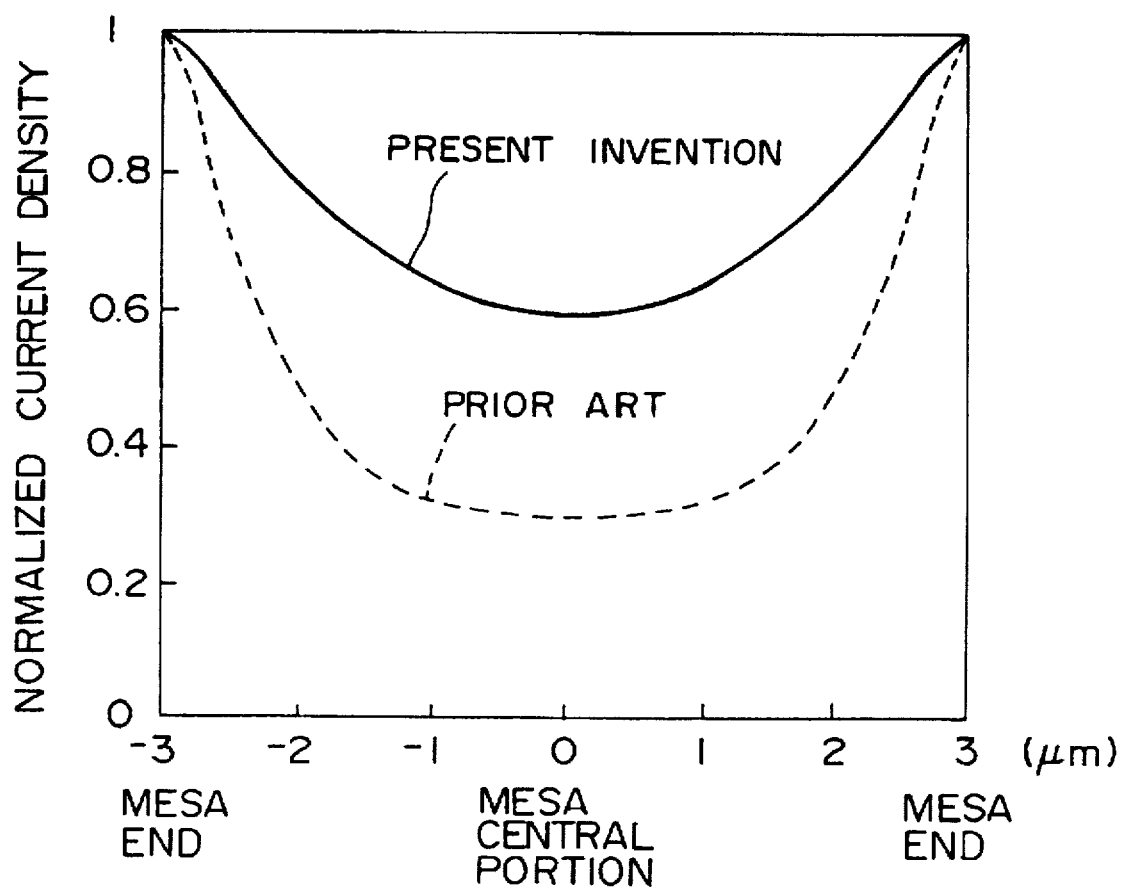
FIG. 4 is a graph showing the spatial distributions of currents injected into active layers.

FIG. 4 show the spatial distributions of currents injected into the active layers to compare them with each other, in which the ordinate indicates the normalized current density; and the abscissa, the distance (μm) from the central mesa portion to a mesa end. This graph shows the result obtained by calculating the spatial distributions of currents injected into the active layers of the conventional double mesa structure and the structure of the present invention.

According to the present invention, since the thickness of the p-type GaAs layer is increased from ¼ times the oscillation wavelength to ¾ times the oscillation wave-length, even when current components are injected from the side portions of the mesa, the current components spread into the semiconductor layer in the lateral direction. With this effect, the density of the current injected into the central mesa portion can be increased from 30% of the current density at a mesa end (in the conventional structure) to 60%.

As described in detail above, according to the present invention, since an etching process can be easily controlled, the uniformity in element manufacturing processes can be improved. In addition, a surface emission laser can be manufactured, in which since an injected current spreads in the lateral direction, the element resistance is lower than that in the prior art, and the uniformity in the distribution of the current injected into the active layer is improved.

What is claimed is:

1. A surface emission laser having a semiconductor multilayer reflector of a first conductivity type, a clad layer of the first conductivity type, an active layer, a clad layer of a second conductivity type, and a semiconductor multilayer reflector of the second conductivity type, which are sequentially stacked on each other, wherein said semiconductor multilayer reflector of the second conductivity type has a mesa shape, an electrode is formed on mesa side surfaces and a portion of a mesa bottom surface, and one semiconductor film of said semiconductor multilayer reflector of the second conductivity type which serves as the mesa bottom surface has a thickness (¼+n/2, where n is a positive integer) times an oscillation wavelength.

2. A surface emission layer according to claim 1, wherein a current from said mesa bottom surface spreads uniformly within said active layer.

3. A surface emission laser having an n-type semiconductor multilayer reflector, an n-type clad layer, an active layer, a p-type clad layer, and a p-type semiconductor multilayer reflector, which are sequentially stacked on a semiconductor substrate, wherein said p-type semiconductor multilayer reflector has a mesa shape, an electrode is formed on at least mesa side surfaces and a portion of a mesa bottom surface, and a GaAs film of said p-type semiconductor multilayer reflector which serves as the mesa bottom surface has a thickness (¼+n/2, where n is a positive integer) times an oscillation wavelength.

4. A surface emission layer according to claim 3, wherein a current from said mesa bottom surface spreads uniformly within said active layer.

5. A method of manufacturing a surface emission laser comprising the steps of forming a resonator structure on a semiconductor substrate, said resonator structure having p- and n-type semiconductor multilayer reflectors on and under a p-n junction structure for producing an optical gain upon injection of a current, each of said reflectors being formed by alternately stacking semiconductor layers having different refractive indexes, forming a mesa by etching, and forming an electrode for current injection to cover said mesa, wherein a thickness of a semiconductor layer, of the semiconductor layers alternately stacked on each other to form said semiconductor multilayer reflector on said p-n junction structure etched on said semiconductor substrate, to which an etching process is stopped, is (¼+n/2, where n is a positive integer) times an oscillation wavelength.

6. A method according to claim 5, wherein said semiconductor multilayer reflector on said p-n junction structure etched on said semiconductor substrate comprise a p-type semiconductor multilayer reflector, the semiconductor layers alternately stacked on each other comprise p-type AlAs layers and p-type GaAs layers, respectively and the semiconductor layer of the semiconductor layers to which an etching process is stopped comprise a p-type GaAs layer.

7. A method according to claim 5, wherein said p- and n-type semiconductor multilayer reflectors on and under said p-n junction structure for producing an optical gain upon injection of a current, each of said reflectors being formed by alternately stacking semiconductor layers having different refractive indexes, are formed by alternately stacking two types of semiconductor layers having different refractive indexes, and said reflectors are formed on said semiconductor substrate by epitaxial growth.

* * * * *